United States Patent [19]
Cox

[11] Patent Number: 5,699,668
[45] Date of Patent: Dec. 23, 1997

[54] MULTIPLE ELECTROSTATIC GAS PHASE HEAT PUMP AND METHOD

[75] Inventor: Isaiah Watas Cox, Eli, Israel

[73] Assignee: Boreaus Technical Limited, London, England

[21] Appl. No.: 422,076

[22] Filed: Mar. 30, 1995

[51] Int. Cl.$^6$ ............................................. F25B 21/00
[52] U.S. Cl. ......................... 62/3.1; 165/1; 165/104.23
[58] Field of Search ...................... 62/3.1, 3.2; 165/1, 165/104.23

[56] References Cited

U.S. PATENT DOCUMENTS

| | | | |
|---|---|---|---|
| 2,510,397 | 6/1950 | Hansell | 62/3.1 |
| 3,282,267 | 11/1966 | Eidus | 62/3.2 |
| 4,004,210 | 1/1977 | Yater | 322/2 |
| 4,396,055 | 8/1983 | Mitchell | 165/1 |
| 4,463,798 | 8/1984 | Pogson et al. | 165/1 |
| 4,947,648 | 8/1990 | Harwell et al. | 62/3.3 |
| 5,040,381 | 8/1991 | Hazen | 62/3.2 |
| 5,356,484 | 10/1994 | Yater et al. | 136/200 |

FOREIGN PATENT DOCUMENTS

| | | | |
|---|---|---|---|
| 861916 | 9/1981 | U.S.S.R. | 165/104.23 |
| 883644 | 11/1981 | U.S.S.R. | 165/104.23 |

OTHER PUBLICATIONS

Joseph Yater "Physical Basis of Power Conversion of Energy Fluctuations" Jul. 1982, Physical Review A.

*Primary Examiner*—William Doerrler

[57] ABSTRACT

In the method of the present invention, electrostatic fields are used to induce heat pumping action of a working fluid. A plurality of heat pumps with no moving parts are used. The operation of the one pump enhances the operation of the next. The method of the present invention is conducive to devices of a wide range of scales. Furthermore, operation at partial power levels is practicable, and precise control of temperature possible. Control is further enhanced by the addition or removal of further units to the system. Reliability should be enhanced, and peak power demands reduced. Wide selection of possible working fluids allows for the elimination of environmentally harmful halocarbons. In one embodiment of the present invention, chemical working fluids are eliminated entirely. In another embodiment, supercooled fluids such as liquid helium may be used while eliminating the wastage commonly encountered using such fluids.

48 Claims, 3 Drawing Sheets

MULTIPLE ELECTROSTATIC GAS PHASE HEAT PUMP AND METHOD

BACKGROUND

FIELD OF INVENTION

The present invention relates to refrigerators, and in particular to an improved method of utilizing electrostatic heat pumps and similar devices.

BACKGROUND

PRIOR ART

A heat pump, as used in refrigerators and similar systems, is a device which transfers heat from one place to another, generally against a thermal gradient. For example, in a refrigerator, heat is 'pumped' from the cold box to the ambient air. This is commonly achieved by evaporating a refrigerant fluid. As the fluid evaporates, it takes up heat from its surroundings, a technique well known to the art. The resulting vapor is both moved to another part of the device and compressed by an electric pump. The now hot compressed vapor dissipates its heat to the surroundings and liquefies, whereupon the cycle may begin again.

All such devices are subject to wear and tear insofar as they require the use of motorized elements and moving parts. Additionally, there is a danger that the compressor may be damaged if fluid condenses at the wrong stage in the process. Furthermore, such devices are noisy. Such devices are also inefficient insofar as the degree of heat transference which may be achieved is necessarily limited to the capacities of the individual unit.

Typically, compressors are relatively inexpensive when used in conventional refrigerators. But when they are used in applications of a different scale, they become increasingly expensive. In very small-scale applications a suitable compressor may cost more than the entirety of the rest of the device. In industrial-scale applications, such as cold storage rooms, the process also commonly requires the use of a motorized fan to cool the electric pump at an additional cost in energy consumption, noise, and expense.

Conventional refrigeration systems typically experience temperature fluctuations within the refrigerated compartment, caused by the 'on' or 'off' nature of the compressor based systems. They also suffer long delays when changing from one temperature to another. Previous refrigeration systems commonly used halocarbons as refrigerant fluids. These fluids are a known source of stratospheric chlorine, and are thus possibly linked to stratospheric ozone depletion. The use of such refrigerant fluids may be a cause of widespread public anxiety about possible environmental damage.

Such fluids are increasingly likely to come under the control of environmental and other agencies. Improvements in the art have resulted in the use of hydrocarbon and halo-hydrocarbon fluids which do not deplete atmospheric ozone. These fluids can be made to operate as efficiently as halocarbons, but only in conjunction with improved design. These fluids also may be more expensive than conventional halocarbons. In any case, the problems of noise, wear and tear, temperature control and cost effectiveness at extreme scales of use are not solved by this improvement.

Mori, in Japan, 4251178, dated Jul. 9,1992 addresses the problem of coolants containing a large proportion of water which may freeze and damage the delicate instruments whose cooling Mori envisages. Mori introduces a second return path of steam, which maintains the water coolant at a regular temperature. The steam is delivered by a gravity pipe, inclined to provide the correct mixture of steam and water to prevent freezing. Since it is the phase change of evaporation from liquid to gas which provides the cooling in Mori, the temperature of the coolant itself is of no consequence as long as it remains within reasonable limits. Mori's solution is ingenious, but involves somewhat cumbersome engineering, relying on auxiliary pipes, a separate source of steam, and the fixed orientation of the whole device in order that gravity may bear in the appropriate direction.

Developments in electronics have been called in to assist the basic arrangement of working fluid, evaporator and condenser, with much work in the field of heat pipes. A heat pipe is a device which enhances the natural flow of heat from hot to cold, and as such is not a heat pump, which can also 'pump' heat against the natural flow, that is, from cold to hot, as in a domestic refrigerator, where heat is removed from an already cold area—the inside of the refrigerated compartment—and pumped to a warmer area—typically, the area outside the refrigerator. The usefulness of heat pipes and heat pumps coincides where, for example, it is desired to cool hot objects down to ambient temperatures.

Electrostatic pumping has been used in conjunction with heat pipes to return a working fluid from condenser to evaporator, as shown by V M Burmistrov, Soviet Union document number 0861916, dated Oct. 9, 1981.

Burmistrov discloses an electro-hydrodynamic heat pipe in which needle electrodes in the condensation area charge the working fluid which is then electrostatically pumped back to the evaporation area. Burmistrov's device cannot however pump heat from cold to hot.

In Soviet Union document number 0883664, As Mold Appld Phys, a wick of different sized meshes is used to enhance the flow of the dielectric fluid through the pipe. Again, this device cannot be used to pump heat from cold to hot.

An exemplary application of the electro-hydrodynamic heat pipe is shown in Mitchell, Jr, U.S. Pat. No. 4,396,055 dated Aug. 2nd 1983, which summarizes with clarity efforts to use electricity as a means of aiding the return of the condensed working fluid to the evaporator, without using unwieldy motorized pumps. Again, it is stressed that in Mitchell, the electrostatic pumping is a device to move the fluid from condenser to evaporator, and the heat pipe is designed to enhance the flow of heat from hot to cold.

These improvements relate to heat pipes, and no mention is made of the use of electrostatic devices which pump heat from cold to hot, acting as true heat pumps. The electrostatic pump element in these disclosures does not pump heat, but pumps the refrigerant fluid back to the evaporator.

The electrostatically pumped heat pipe in U.S. Pat. No. 4,463,798 to Pogson et al 1984 Sep. 6th uses an ion drag pump in place of the conventional motorized pump, used in conjunction with a heat pipe with a condensing area at one end and an evaporating area at the other end. The ion drag pump resides in the condensing area where it uses an electrostatic process to ionize a dielectric refrigerate condensate. The method includes cooling one end of the heat pipe to liquefy refrigerant therein to form a condensate. The ion drag pump applies a sufficiently high voltage across a cathode and anode to produce ions in the condensate, the ions then being accelerated toward the anode so as to create fluid motion and a pumping action through the pump inlet. On arrival at the other end of the heat pipe, heat is applied to evaporate the refrigerant into a vapor. This vapor then flows back to the end of the pipe where it is recovered as a condensate by cooling.

The Pogson et al heat pipe enhances the flow from a hot body to a cold body with respect to the unassisted heat flow. It is intended for applications in avionics, the cooling of missile systems, and for use in cooling fuel carried by spacecraft and large satellite systems. It is accordingly of no relevance to terrestrial applications of the art where the object is to remove heat from a cold body and transfer it to a hot body or to warmer surroundings, as is the case with refrigerators and similar devices.

It is a particular object of this prior art to enable a fluid refrigerant condensate to be transported over further distances than is possible using conventional heat pipes. This is also of no special advantage in applications of the art where there is no need for an especially long pipe.

Also in the prior art is the thermo-electric cooler or "Peltier effect" device. This device is essentially a thermocouple operated in reverse, pumping heat from one junction to another while under the influence of an electric current.

Typical of Peltier Effect applications is Hazen whose Apparatus for Cooling Circuits, U.S. Pat. No. 5,040,381, 1991, Aug. 20th, discloses with admirable clarity the principles of applying dielectric materials of differing conductivity in contiguous layers in order to induce heat to flow in a desired direction.

Harwell, in his Thermoelectric Refrigeration Apparatus, U.S. Pat. No. 4,947,648, 1990, Aug. 14 1990, discloses a series of nested Peltier devices separated by thermally insulating domes, to combine these inefficient devices into a single refrigerator for cooling optical radiation detectors, while as long ago as 1966, Nov. 1st, William Eidus, in his Thermoelectric Hypothermia Instrument, U.S. Pat. No. 3,282,267, disclosed a group of Peltier Effect devices arranged in a hinged chain in order to reduce the swelling associated with post-operative convalescence from cosmetic surgery.

Such devices are easily scalable and are particularly suited to small scale applications. They may also be used in multiple configurations to enhance the degree of heat transference obtainable. However such devices typically require expensive materials to produce, and are quite inefficient in their use of electricity.

The Electrostatic Gas Phase Heat Pump and Method of Jonathan Edelson, Patent applied for 1995, 7th Mar., registration Ser. No. 08/401,038 uses two electrodes separated by a porous insulating material to form an electrostatic heat pump which solves most of the prior art disadvantages listed above, and is considerably more efficient than Peltier Effect devices.

In this invention, a cathode ionizes a working fluid, which creates a phase change by which heat is absorbed from the surrounding area. This heat is carried by the extra electron which attaches itself to each molecule of the working fluid, and, being now charged, is attracted to the anode of the device, where the charge is neutralized, and the fluid condenses, to be returned once again to the cathode.

However, in common with other prior art applications, the Edelson method still suffers from being inefficient when used as a unitary device in applications requiring wide temperature differentials. While a single unit might well provide a suitable level of heat transference for devices such as domestic refrigerators, it is inefficient as a means of achieving extreme temperatures such as those used in industrial processes where, for example, volatile gases may be stored as cryogenic liquids.

The use of an electron flow as the working fluid for a refrigeration system is unknown to the art, excepting for a brief reference in the above Edelson application.

However, the principles of thermionic emission are in themselves well-known to the art, in the construction of display systems, such as cathode ray tubes or flat panel displays, and in thermionic generators, such as Clarence Hansell's Heat-to-Electrical Energy Converter, U.S. Pat. No. 2,510,397, of 1946, Oct. 2nd.

Hansell's invention describes a device where electrons are 'evaporated' from a surface into a working fluid, specified as a vapor, in order to ionize it. These electrons are carried to an anode where the heat they carry is converted to electricity, returning to the cathode as part of a load. The continuous emission of these electrons is ensured by maintaining a continuous application of external heat to the cathode.

It is clear that Hansell's device cannot be used as a cooling device, and indeed, in certain applications requires to be cooled itself by external means, as Hansell recognized, but as an early account of the 'evaporation' of electrons from a surface and their conveyance to an anode where they become neutralized, it is worthy of note in respect of the application of this phenomenon to cooling devices.

OBJECTS AND ADVANTAGES

Accordingly, besides the objects and advantages of the methods of pumping heat in refrigerators and similar devices described in my above patent, several objects and advantages of the present invention are as follows:

An advantage of the present invention is the elimination of inefficiencies arising from the use of single self-contained refrigeration units to achieve a desired level of heat transference.

It is accordingly an object of the present invention to provide an improved method of refrigeration which is more efficient than previous methods.

Another advantage of the present invention is an improvement in the temperature gradient of refrigeration devices, such that using the present invention devices may be created which substantially broaden the temperature differentials which may be achieved by such devices without requiring disproportionate extra costs.

Accordingly it is a further object of the invention to provide a method of refrigeration which can be used to achieve substantial temperature differentials at greater efficiency than previous methods.

It is a yet further object of the invention to provide a method of refrigeration which achieves substantial temperature differentials more inexpensively than previous methods.

Another advantage of the present invention is that it provides greater flexibility and scalability in the creation of refrigeration devices allowing a manufacturer of such devices to manufacture devices of many different shapes and sizes and physical properties.

Accordingly it is a further object of the present invention to provide a method of refrigeration which may be applied to devices of unusual as well as conventional dimensions.

Yet another advantage of the present invention is that it eliminates much of the work involved in designing new refrigeration devices for specific applications, insofar as it improves upon previous methods by allowing a measure of synergy in the construction of different devices.

Accordingly it is a yet further object of the present invention to provide a method of refrigeration which introduces a greater opportunity for standardization into the manufacturing process.

It is an advantage of the present invention that it improves directly upon the Electrostatic Gas Phase Heat Pump method of the Edelson prior art without sacrificing any of the advantages of that prior art.

Accordingly it is an object of the present invention to provide a method of using the Electrostatic Gas Phase Heat Pump which substantially enhances the usefulness of that invention while maintaining its advantages over other applications of the art.

Still further objects and advantages will become apparent from a consideration of the ensuing descriptions and drawing.

DESCRIPTION OF DRAWINGS FIGURES

FIG. 1 shows a schematic aspect of the Edelson electrostatic gas phase heat pump.

Elements of FIG. 1 are not in strict proportion to the actual device, but represent its operating principles. The distance between parts 10 and 12 is much smaller in relation to the whole than can be represented in a drawing. Many elements are shown which would be used in a practicable embodiment of the present invention; however these elements are not strictly necessary for the basic functionality of the present invention.

REFERENCE NUMERALS IN DRAWINGS

Figure 1:
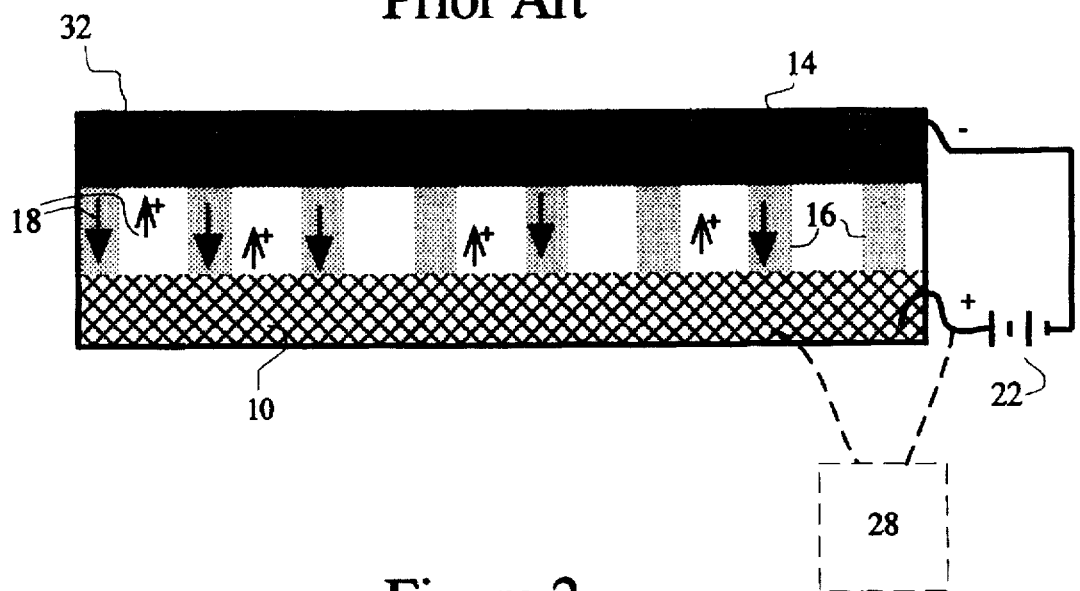

10 Porous electrode
12 Sharp ridge on surface of porous electrode
14 Porous electrode
16 Porous insulator
18 Working fluid
20 Electric field, represented by lines of equal voltage
22 Direct Current power supply
28 Thermostatic controller
32 Enclosure
33 Flexible Material

DESCRIPTION AND OPERATION OF THE INVENTION—FIGS. 1,2,3,4

Figure 2:
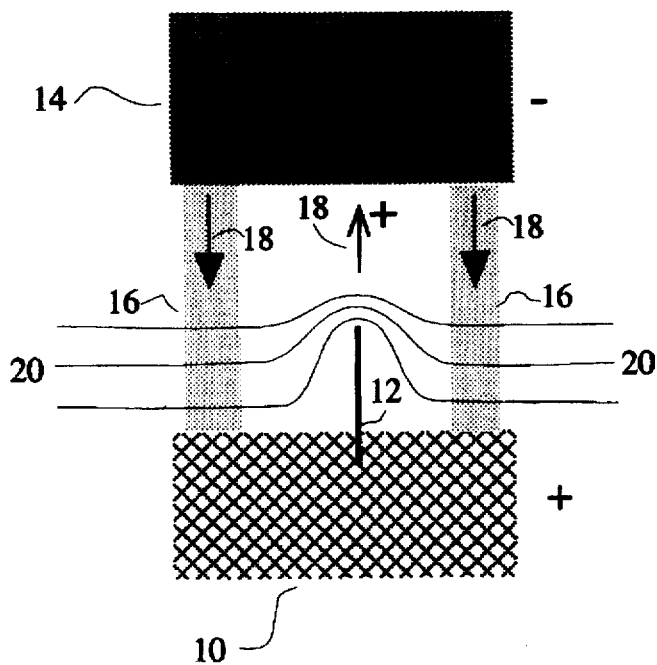
FIG. 2 shows a schematic representation of a sample detail of FIG. 1, to better illustrate the process described in the following specification.
Figure 3:
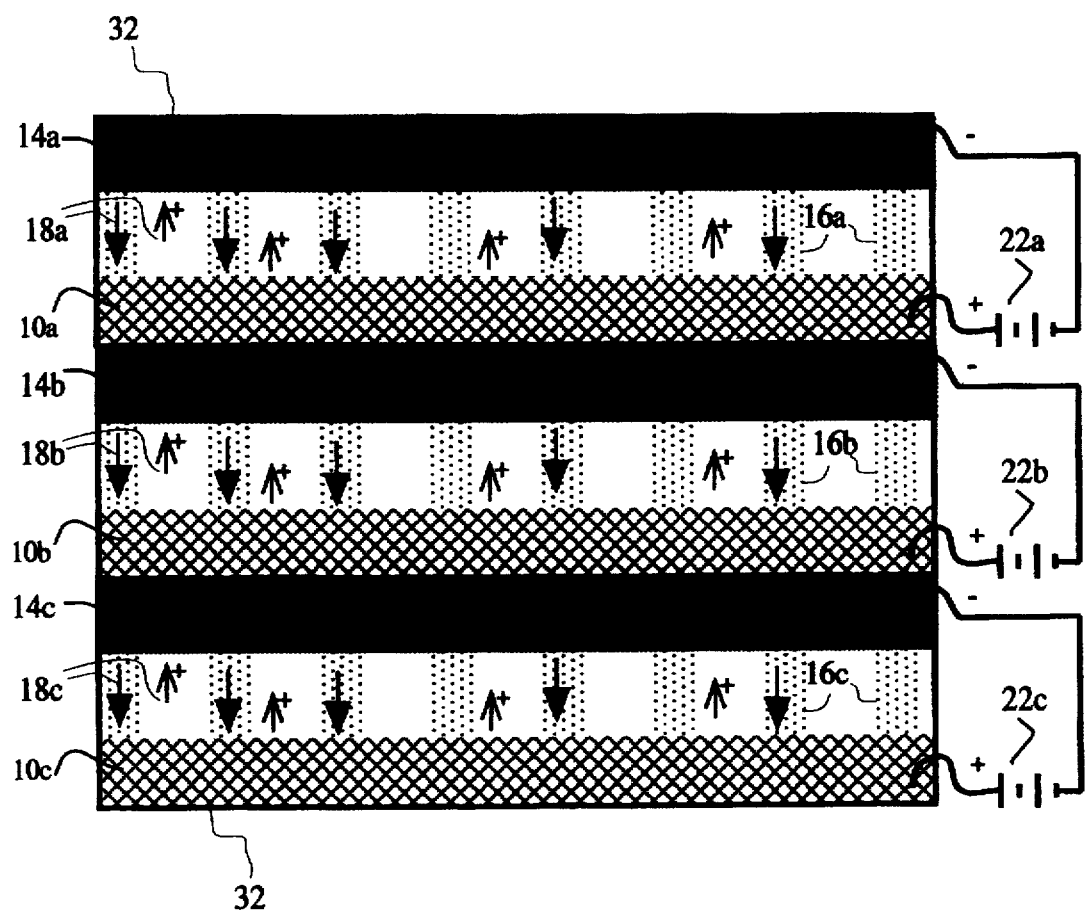
FIG. 3 shows a possible embodiment of the invention where heat pumps are stacked vertically.
Figure 4:
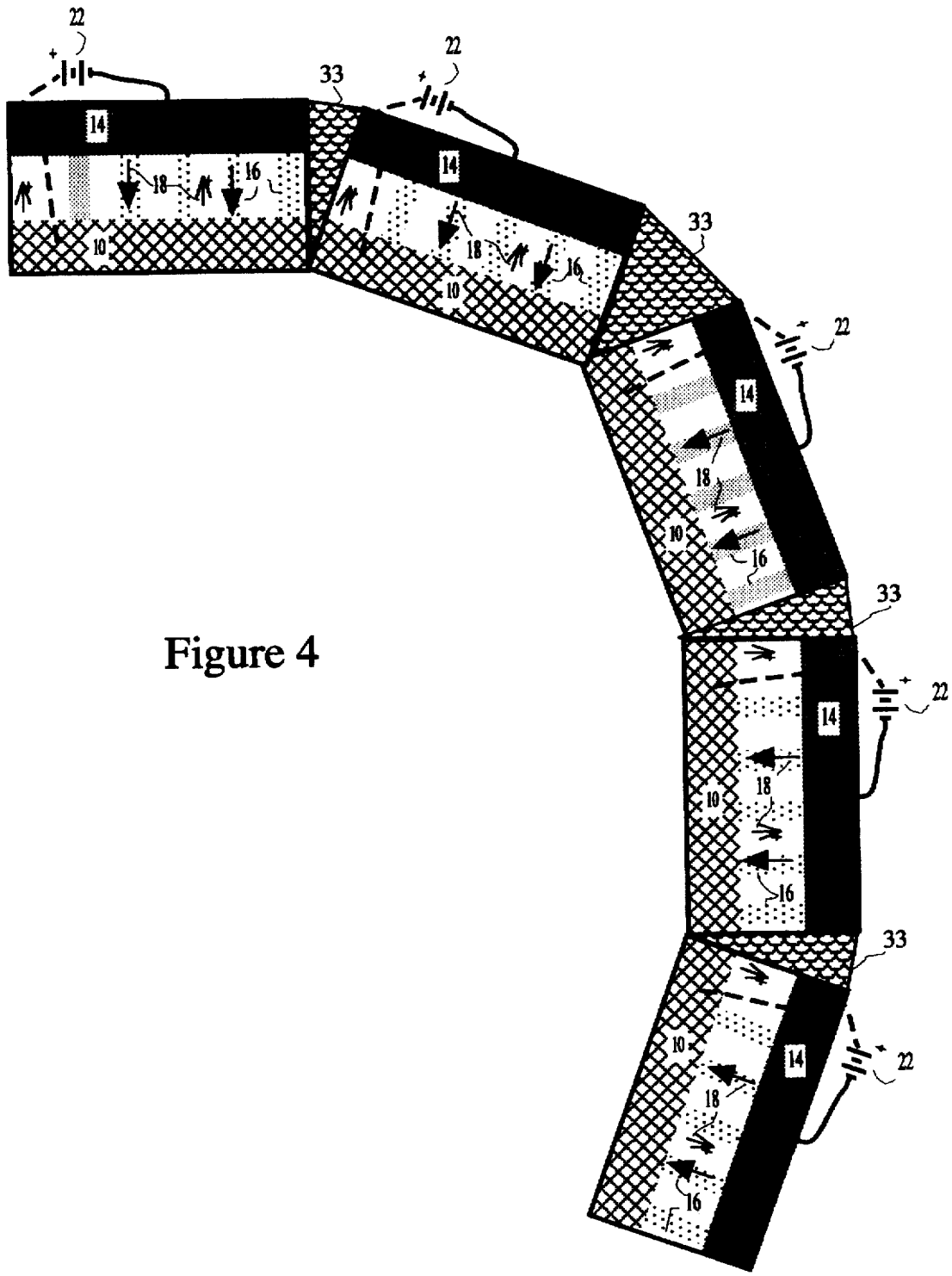
FIG. 4 shows a possible embodiment of the invention where heat pumps are arranged in a chain.

A typical embodiment of the Edelson electrostatic gas phase heat pump is illustrated in schematic aspect in FIG. 1. FIG. 2 illustrates a small section of FIG. 1, the better to demonstrate the details of the process in operation. FIGS. 3 and 4 represent possible configurations of a plurality of Edelson electrostatic gas phase heat pumps using the method of the present invention. It is in this plurality that the novelty and usefulness of the present invention resides.

A porous electrode 10 is situated on one side of the device. The inner surface of electrode 10 may be characterized by a large number of sharp ridges 12 (FIG. 2). A surface with such ridges is preferred for the purposes of the embodiment, but other surface textures may be used in this and other possible embodiments of the invention.

A porous electrode 14 is situated opposite electrode 10, on the other side of the device. Electrode 14 is of generally smooth surface, as compared to the large number of sharp ridges of electrode 10. A non-conductive porous insulator 16 is situated between electrode 10 and electrode 14.

The distance between electrode 10 and electrode 14, and consequently the thickness of insulator 16, will be small, but both will vary depending on the application and applied voltage. A direct current electrical power supply 22 is connected via appropriate means to electrodes 10 and 14. Such means include wires and conductive plates, as is well known in the art.

In this embodiment, a positive potential is applied to electrode 10 and a negative potential to electrode 14. In other embodiments of the present invention, a negative potential may be applied to electrode 10 and a positive potential to electrode 14. Such an opposite polarity may be used, for example if the present fluid ionizes to negative ions rather than positive ions, or if electrons are being used as the working fluid, requiring a negative charge on the evaporator plate.

Insulator 16 and electrodes 10 and 14 contain dielectric fluid 18. Fluid 18 may be passed through insulator 16 in vapor or liquid form. Arrows in FIGS. 1 and 2 show the direction of flow of fluid 18 through and around porous insulator 16.

In the embodiment of a heat pump element in a refrigerator, heat would be carried to electrode 10 via heat conductive means as known in the art.

Power supply 22 applies a direct current to electrode 10 and electrode 14. The action of the power supply is to produce a voltage differential between electrode 10 and electrode 14 generating a region of potential gradient between said electrodes 10 and 14. In the present embodiment a small potential difference will be associated with a very high potential gradient, as caused by the close proximity of electrodes 10 and 14. In other possible embodiments a larger potential difference may be used to maintain the desired high potential gradient in the case of greater distance between electrodes 10 and 14. Insulators 16 act to maintain proper spacing between electrodes 10 and 14.

While the potential difference depends entirely upon the spacing of the electrodes, such that the greater the space between them, the higher the voltage required, the amount of heat pumped across that space is determined by the level of current applied.

As a base for calculation, a current of 10 amperes per square centimeter will transfer 4.2 Watts per second of heat energy, where the refrigerant fluid is distilled water. Different current densities will be required for different refrigerant fluids, ranging from two orders of magnitude below, to half an order of magnitude above, the figures given. Thus a wide range of performance characteristics may be obtained, depending on whether economies in power consumption or material costs is most desirable.

Insulators 16 are further composed of a porous material and act to provide a return path for dielectric fluid 18. In the present embodiment of the invention electrodes 10 and 14 and insulator 16 are composed of porous materials and act to distribute the liquid phase of dielectric fluid 18 by capillary action. Fluid 18 has the property of being readily ionizable.

Accordingly under the influence of the potential gradient, ions tend to evaporate from the surface of electrode 10 and be thrust towards electrode 14. It is the evaporation and ionization of molecules at electrode 10 that comprises the heat absorbing phase change of the heat pump. The corresponding condensation and neutralization of molecules at electrode 14 comprises the heat releasing phase change of the heat pump.

In this embodiment molecules of dielectric fluid 18 easily lose electrons to form positive ions. In this case, electrode 10 is provided with a positive charge. In another embodiment electrons are gained in the ionization process, requiring that electrode 10 be provided with a negative charge. To enhance the release of ions at electrode 10, electrode 10 may be provided with a large number of xyresic striations, sharp raised ridges, or needle-like protrusions 12 on its inner surface.

These surface structures all act to distort the electric field 20 (FIG. 2) causing at the tips of ridges 12 (FIG. 2) regions of extremely high localized potential gradient. At these locations the chances of ionization are greatly enhanced. In the method of this embodiment electrode 10 is provided with such a striated surface and electrode 14 is provided with a smooth surface, enhancing the evaporation of ions from electrode 10 over the detrimental evaporation of ions from electrode 14.

In other possible embodiments smooth surfaces may be used on both electrodes. This would require the use of a higher potential difference to provide the required surface potential gradient. In yet another embodiment of the present invention, both surfaces may be provided with ridges, providing the capability of bipolar operation.

Under some embodiments of the invention a thermostatic controller 28 (FIG. 1) may be used to modulate power supplied by power supply 22. Such a device would allow for precise control of temperature of the system. Many such devices are known to the art.

The present invention and method therefore comprises a plurality of devices such as that described above placed together such that the outer face of electrode 14 in one device abuts the outer face of electrode 10 in another similar device. FIGS. 3 and 4 demonstrate two possible embodiments of the present invention.

In FIG. 3 the devices are stacked one upon another, such that dielectric fluid 16 may pass through porous electrodes 14a, 10b, 14b, 10c and 14c. FIG. 3 shows three such devices, for the purposes of illustration only. Therefore FIG. 3 should not be regarded as a limitation on the present invention, but merely a convenient means of illustrating the method.

In FIG. 4 the devices are arranged horizontally such that dielectric fluid 16 may pass through porous electrodes 14, 10, 14, 10 and 14. FIG. 4 shows three such devices, for the purposes of illustration only. Therefore FIG. 4 should not be regarded as a limitation on the present invention, but merely a convenient means of illustrating the method.

In both embodiments, FIG. 3 and FIG. 4, fluid 18, upon reaching electrode 14a, condenses and releases heat at electrode 14a. Electrode 14a is in thermal contact with electrode 10b, so the heat released at electrode 14a will enhance the evaporation and ionization of fluid 16 at electrode 10b, continuing the process already described. The present invention accordingly uses the heat transferred by one pump to enhance the operation of the next, thus providing a means whereby greater temperature differentials may efficiently be achieved.

Possible embodiments of the present invention may involve the use of different materials and fluids in each unit, thus altering the properties of the system as a whole. This may be of particular application to systems where a fluid suitable for use at one temperature is no longer suitable at the much lower temperatures achieved in other units of the system.

In another embodiment of the present invention, each distinct heat pump unit as described in FIGS. 1 and 2 might be mounted on racks such that individual units may be added or removed to alter the configuration and resultant temperature gradients of the complete system.

In the embodiment of FIG. 3 where the devices are stacked vertically, the return path of fluid 18 may be enhanced by the action of gravity, so that in gas phase fluid 18 is pumped upwards by the electrostatic pump, while in liquid phase it flows back down through porous insulator 16 or through an alternative return path such as a pipe.

In possible embodiments where thermostatic controller 28 (FIG. 1) is used, a plurality of such thermostatic controllers may be used, one for each device, capable of independent operation such that the operation of each individual device may be independently regulated.

A factor to be considered in the present invention is the bulk evaporation of non-ionized molecules of fluid 16. The method of the present invention seeks to minimize such bulk evaporation as it will tend to carry heat detrimentally from electrode 14 to electrode 10.

However in other embodiments of the present invention such bulk evaporation may be used beneficially. For example, if ion flow rate is great enough it will tend to pump the bulk evaporated material in the desired direction.

In yet another embodiment the present invention is used to enhance heat pipe activity with each bulk evaporation being directly beneficial. As ions are thrust from electrode 10 towards electrode 14, these ions pass through the open space between electrode 10 and electrode 14.

The flow of ions towards electrode 14 must be balanced by the flow of non-ionized liquid back towards electrode 10. As the density of the liquid is substantially higher than that of the ionized vapor the cross section of the return path is a correspondingly small part of the total area between electrodes 10 and 14.

In general insulator 16 will be a porous material such as sintered glass, capable of carrying the return fluid flow by capillary action. Alternative materials may be used in this and other embodiments such as sintered fiberglass, various ceramics, or impermeable insulators combined with external piping or internal piping.

When ions arrive at electrode 14 the electric current provided by direct current power supply 22 neutralizes the ions. In the present embodiment electrode 14 has a negative charge and provides electrons to neutralize the positive ions thrust towards electrode 14 from electrode 10. In another embodiment, the opposite polarity is also possible.

In the present embodiment the ions condense to form a bulk liquid to be distributed by capillary action. In another embodiment of the present invention, a pure gas phase system may be constructed wherein the neutral gas is carried back to electrode 10 to complete the working fluid cycle. In a further variation on the present embodiment the use of a working fluid with ionization phase change is further generalized to the use of electrons as the working fluid.

In such an embodiment electrode 10 would be negatively charged. Electrons are subject to thermionic emission, considered to be a form of evaporation for the purpose of the present invention. Electrons are emitted from the surface of electrode 10 and are thrust towards electrode 14 in the fashion of an ionized molecule as describe in the present embodiment.

The emission of such electrons absorbs heat from electrode 10 and deposits the heat so absorbed at electrode 14.

The return path for the working fluid is then the external electrical circuit, simplifying the selection of electrodes and the construction of the heat pump device.

The whole process is contained within enclosure 32 which should be constructed to contain fluid 18 and provide support for electrodes 10 and 14. It is likely that enclosure 32 will be constructed of an electrically insulating material, but it is possible to envisage applications where the use of electrically conductive materials enhances the flow of current to electrodes 10 and 14. In vacuum applications using electrons for heat pumping action it may be possible to eliminate enclosure 32 entirely.

In the present invention, enclosure 32 should also be constructed so as to contain all the devices required by a specific embodiment. In other possible embodiments a flexible material 33 (FIG. 4) may be used to link the devices together so that they may be installed in varying configurations. Such configurations might include curved surfaces or narrow and awkward spaces.

CONCLUSION, RAMIFICATIONS AND SCOPE OF THE INVENTION

Thus the heat pump of the invention provides a wide-ranging series of improvements to existing heat pumps used in refrigerators and similar devices which transport heat from one part of a system to another. The present invention requires no moving parts. It can be manufactured using inexpensive, readily available materials which do not release potentially harmful halogens into the atmosphere. It offers a wide range of choice of materials and working fluids, allowing applications to be created for maximum specific efficiency, or to take account of changes in the relative costs of different materials. Because it uses no mechanical compressors, the present invention is equally suitable for use in very small, medium and large-scale applications. The use of an electrostatic pumping process allows for continuous and accurate control of temperatures by varying the voltage applied to the electrodes, and for a swift change between temperatures, for example when defrosting or re-powering a domestic refrigerator.

The invention further improves upon previous inventions by combining heat pump elements together to form larger systems, which will achieve a much greater level of heat transference than was possible in previous applications. It is therefore of especial value when applied to situations where very low temperatures a required, such as those used in supercooled electronic applications.

Because the invention relies upon multiple units, the configuration of a particular application is more flexible. A number of small units may be combined in a long, thin, strip which can then be attached to surfaces of unusual or awkward shape, such as the surface of an engine housing.

Units may also be combined in rack systems where an individual unit may be swiftly added or removed to alter the temperature maintained while conserving power efficiently. Such an application might be of especial value in the transportation of goods by refrigerated container, where the temperatures required for one set of goods transported differs from the temperature required for another load.

While my above description contains many specificities these should not be construed as limitations on the scope of the invention, but rather as an exemplification of some of the presently preferred embodiments thereof.

Many other variations are possible. For example, the process could be applied to the control of temperatures in a sensitive environment where no great change in temperature is needed, but where swift and accurate maintenance is the priority. The process could also be applied to miniaturized heat control systems for microprocessors. The process could be applied on a large scale to cooling systems for cold stores, factory farming ships and similar large devices, especially where noisy compressors and fans are a drain on energy and render working conditions unpleasant and/or potentially unsafe.

In particular, the stacking of devices allows manufacturers the benefit of synergy in constructing different devices for different applications using the same basic unit in combination with other such units.

The direction of heat flow may also be reversed to improve upon the Pogson et al prior art by pumping heat from an already hot area to a cold one, for the cooling of hot engines, inflammable fuels and the areas around furnaces. In this case, the present invention would distinguish from the prior art by applying the ion pump to a vapor instead of through a condensate. The wide range of materials which can be used as an alternative to the preferred materials is a further strength of the process leading to many combinations of materials for the electrodes and insulator and working fluids. Sintered metals are an obvious alternative to sintered glass or sintered fiberglass.

Any dielectric fluid can be used as the working fluid in the process. It is even possible that water could be used for warmer temperature applications. Further, the use of a separate chemical working fluid may be eliminated entirely through the use of electrons as the working fluid. Because the system is a closed system, substantial savings in cost are achieved in cooling applications where the working fluid is gaseous at ambient temperatures such as liquid helium. Such fluids in systems which are not closed tend to boil away, requiring the purchase of increased quantities.

Accordingly the scope of the invention should be determined not by the embodiment illustrated, but by the appended claims and their legal equivalents.

I claim:

1. A heat transference system comprising a plurality of electrostatically pumped heat transference devices wherein said devices each comprise
   a) an evaporator electrode
   b) a condenser electrode
   c) a direct current power supply connects to said electrodes by suitable wiring means
   d) separation means whereby said electrodes are held apart
   e) a working fluid whereby heat may be absorbed at said evaporator electrode, said heat being released at said condenser electrode, said condenser electrode being at a higher or lower temperature than said evaporator electrode, the improvement wherein being that said devices are arranged so as to enable said fluid to move from one said device to another by action of gravity.

2. The system of claim 1 wherein the number of said plurality of said devices in operation at any one time is controlled by a thermostatic controller whereby temperature may be regulated.

3. The system of claim 1 wherein the operation of said devices is controlled by multiple thermostatic controllers, whereby temperature may be regulated.

4. The system of claim 1 wherein said devices are contained within a framework which may be varied in configuration, whereby said varied configuration would optimize said system for a given application.

5. The system of claim 1 wherein a framework contains said devices such that the properties of devices contained within said framework may be varied, in consequence of which the properties of said system may be varied.

6. The system of claim 1 wherein different materials are used in the construction of said devices such that one device may vary from another, whereby the properties of said system may be altered.

7. The system of claim 1 wherein said devices are optimized for given applications, whereby a given device is optimized in terms of said electrodes, said separation means, said working fluid and said power supply, for a relatively warmer operating temperature, and another in similar manner for a colder operating temperature so that the warmer performs initial heat-pumping, and the subsequent device performs further heat-pumping, each ideally within their respective efficacy ranges.

8. The system according to claim 1 in which said devices are respectively configured in a different manner for given applications.

9. A heat transference system comprising a plurality of electrostatically pumped heat transference devices wherein said devices each comprise
   a) an evaporator electrode
   b) a condenser electrode
   c) a direct current power supply connects to said electrodes by suitable wiring means
   d) separation means whereby said electrodes are held apart
   e) a working fluid whereby heat may be absorbed at said evaporator electrode, said heat being released at said condenser electrode, said condenser electrode being at a higher or lower temperature than said evaporator electrode,
the improvement wherein being that said devices are arranged so as to enable said fluid to move from one said device to another by capillary action.

10. The system of claim 9 wherein the number of said plurality of said devices in operation at any one time is controlled by a thermostatic controller whereby temperature may be regulated.

11. The system of claim 9 wherein the operation of said devices is controlled by multiple thermostatic controllers, whereby temperature may be regulated.

12. The system of claim 9 wherein said devices are contained within a framework which may be varied in configuration, whereby said varied configuration would optimize said system for a given application.

13. The system of claim 9 wherein a framework contains said devices such that the properties of devices contained within said framework may be varied, in consequence of which the properties of said system may be varied.

14. The system of claim 9 wherein different materials are used in the construction of said devices such that one device may vary from another, whereby the properties of said system may be altered.

15. The system of claim 9 wherein said devices are optimized for given applications, whereby a given device is optimized in terms of said electrodes, said separation means, said working fluid and said power supply, for a relatively warmer operating temperature, and another in similar manner for a colder operating temperature so that the warmer performs initial heat-pumping, and the subsequent device performs further heat-pumping, each ideally within their respective efficacy ranges.

16. A system according to claim 9 in which said devices are respectively configured in a different manner for given applications.

17. A heat transference system comprising a plurality of electrostatically pumped heat transference devices wherein said devices each comprise
   a) an evaporator electrode
   b) a condenser electrode
   c) a direct current power supply connects to said electrodes by suitable wiring means
   d) separation means whereby said electrodes are held apart
   e) a working fluid whereby heat may be absorbed at said evaporator electrode, said heat being released at said condenser electrode, said condenser electrode being at a higher or lower temperature than said evaporator electrode,
the improvement being that said devices are joined one to another with a flexible material whereby said system may be applied to awkward geometries.

18. The system of 17 wherein the number of said plurality of said devices in operation at any one time is controlled by a thermostatic controller whereby temperature may be regulated.

19. The system of 17 wherein the operation of said devices is controlled by multiple thermostatic controllers, whereby temperature may be regulated.

20. The system of 17 wherein said devices are contained within a framework which may be varied in configuration, whereby said varied configuration would optimize said system for a given application.

21. The system of 17 wherein a framework contains said devices such that the properties of devices contained within said framework may be varied, in consequence of which the properties of said system may be varied.

22. The system of 17 wherein different materials are used in the construction of said devices such that one device may vary from another, whereby the properties of said system may be altered.

23. The system of 17 wherein said devices are optimized for given applications, whereby a given device is optimized in terms of said electrodes, said separation means, said working fluid and said power supply, for a relatively warmer operating temperature, and another in similar manner for a colder operating temperature so that the warmer performs initial heat-pumping, and the subsequent device performs further heat-pumping, each ideally within their respective efficacy ranges.

24. A system according to 17 in which said devices are respectively configured in a different manner for given applications.

25. A heat transference system comprising a plurality of electrostatically pumped heat transference devices wherein said devices each comprise
   a) an evaporator electrode
   b) a condenser electrode
   c) a direct current power supply connects to said electrodes by suitable wiring means
   d) separation means whereby said electrodes are held apart
   e) a working fluid whereby heat may be absorbed at said evaporator electrode, said heat being released at said condenser electrode, said condenser electrode being at a higher or lower temperature than said evaporator electrode,
the improvement wherein being that said working fluid is defined as a flow of electrons through a vacuum between said electrodes.

26. The system of claim 25 wherein the number of said plurality of said devices in operation at any one time is controlled by a thermostatic controller whereby temperature may be regulated.

27. The system of claim 25 wherein the operation of said devices is controlled by multiple thermostatic controllers, whereby temperature may be regulated.

28. The system of claim 25 wherein said devices are contained within a framework which may be varied in configuration, whereby said varied configuration would optimize said system for a given application.

29. The system of claim 25 wherein a framework contains said devices such that the properties of devices contained within said framework may be varied, in consequence of which the properties of said system may be varied.

30. The system of claim 25 wherein different materials are used in the construction of said devices such that one device may vary from another, whereby the properties of said system may be altered.

31. The system of claim 25 wherein said devices are optimized for given applications, whereby a given device is optimized in terms of said electrodes, said separation means, said working fluid and said power supply, for a relatively warmer operating temperature, and another in similar manner for a colder operating temperature so that the warmer performs initial heat-pumping, and the subsequent device performs further heat-pumping, each ideally within their respective efficacy ranges.

32. A system according to claim 25 in which said devices are respectively configured in a different manner for given applications.

33. A method for the transference of heat by electrostatic pumping comprising
   a) causing a high electrical potential gradient between an evaporator electrode and a condenser electrode
   b) applying a direct current to said electrodes
   c) thereby causing a dielectric fluid at said evaporator electrode to evaporate and ionize, forming an ionized gas,
   d) thereby absorbing heat from said evaporator electrode both by said evaporation and by said ionization,
   e) said electrical potential gradient causing said ions to move towards said condenser electrode,
   f) condensing and neutralizing said ions at said condenser electrode, restoring said dielectric fluid and said heat collected at said evaporation electrode,
   g) the passing of said heat to a plurality of sets of electrodes, said passing of said heat resulting in a process whereby the efficacy of said method is enhanced by allowing for each device to cool within their most effective range by passing on the additional cooling burden to another set of electrodes and giving greater flexibility in terms of energy consumption and cooling efficacy,
the improvement wherein being that said condenser electrode is comprised of a porous material whereby said condensing and said neutralization of said dielectric fluid is facilitated.

34. The method of 33 wherein the number of said plurality of said devices in operation at any one time is controlled by a thermostatic controller whereby temperature may be regulated.

35. The method of claim 33 wherein the operation of said devices is controlled by multiple thermostatic controllers, whereby temperature may be regulated.

36. The method of claim 33 wherein said devices are contained within a framework which may be varied in configuration, whereby said varied configuration would optimize said method for a given application.

37. The method of claim 33 wherein a framework contains said devices such that the properties of devices contained within said framework may be varied, in consequence of which the properties of said method may be varied.

38. The method of claim 33 wherein different materials are used in the construction of said devices such that one device may vary from another, whereby the properties of said method may be altered.

39. The method of claim 33 wherein said devices are optimized for given applications, whereby a given device is optimized in terms of said electrodes, said separation means, said working fluid and said power supply, for a relatively warmer operating temperature, and another in similar manner for a colder operating temperature so that the warmer performs initial heat-pumping, and the subsequent device performs further heat-pumping, each ideally within their respective efficacy ranges.

40. A method according to claim 33 in which said devices are respectively configured in a different manner for given applications.

41. A method for the transference of heat by electrostatic pumping comprising
   a) causing a high electrical potential gradient between an evaporator electrode and a condenser electrode
   b) applying a direct current to said electrodes
   c) thereby causing a dielectric fluid at said evaporator electrode to evaporate and ionize, forming an ionized gas,
   d) thereby absorbing heat from said evaporator electrode both by said evaporation and by said ionization,
   e) said electrical potential gradient causing said ions to move towards said condenser electrode,
   f) condensing and neutralizing said ions at said condenser electrode, restoring said dielectric fluid and said heat collected at said evaporation electrode,
   g) the passing of said heat to a plurality of sets of electrodes, said passing of said heat resulting in a process whereby the efficacy of said method is enhanced by allowing for each device to cool within their most effective range by passing on the additional cooling burden to another set of electrodes and giving greater flexibility in terms of energy consumption and cooling efficacy,
the improvement wherein being that said return of said dielectric fluid is accomplish by capillary action through porous materials.

42. The method of claim 41 wherein the number of said plurality of said devices in operation at any one time is controlled by a thermostatic controller whereby temperature may be regulated.

43. The method of claim 41 wherein the operation of said devices is controlled by multiple thermostatic controllers, whereby temperature may be regulated.

44. The method of claim 41 wherein said devices are contained within a framework which may be varied in configuration, whereby said varied configuration would optimize said method for a given application.

45. The method of claim 41 wherein a framework contains said devices such that the properties of devices contained within said framework may be varied, in consequence of which the properties of said method may be varied.

46. The method of claim 41 wherein different materials are used in the construction of said devices such that one device may vary from another, whereby the properties of said method may be altered.

47. The method of claim 41 wherein said devices are optimized for given applications, whereby a given device is optimized in terms of said electrodes, said separation means, said working fluid and said power supply, for a relatively warmer operating temperature, and another in similar manner for a colder operating temperature so that the warmer performs initial heat-pumping, and the subsequent device performs further heat-pumping, each ideally within their respective efficacy ranges.

48. A method according to claim 41 in which said devices are respectively configured in a different manner for given applications.

* * * * *

UNITED STATES PATENT AND TRADEMARK OFFICE
CERTIFICATE OF CORRECTION

PATENT NO. : 5,699,668
DATED : December 23, 1997
INVENTOR(S) : Isaiah Watas Cox

It is certified that error appears in the above-identified patent and that said Letters Patent is hereby corrected as shown below:

Title page, items [75] Inventor:, change "Eli, Israel" to --London, England--.

[73] Assignee:, change "Boreaus" to --Borealis--.

Signed and Sealed this

Second Day of June, 1998

Attest:

BRUCE LEHMAN

Attesting Officer

Commissioner of Patents and Trademarks